(12) United States Patent  
Mawatari et al.

(10) Patent No.: US 7,586,788 B2  
(45) Date of Patent: Sep. 8, 2009

(54) NONVOLATILE SEMICONDUCTOR MEMORY HAVING VOLTAGE ADJUSTING CIRCUIT

(75) Inventors: Hiroshi Mawatari, Kawasaki (JP); Norito Hibino, Kawasaki (JP); Naoto Emi, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 113 days.

(21) Appl. No.: 11/607,090

(22) Filed: Dec. 1, 2006

(65) Prior Publication Data

US 2007/0133303 A1  Jun. 14, 2007

(30) Foreign Application Priority Data

Dec. 2, 2005 (JP) ............................ 2005-348912

(51) Int. Cl.  
*G11C 16/06* (2006.01)
(52) U.S. Cl. .................. 365/185.2; 365/185.18; 365/185.21; 365/185.24; 365/201
(58) Field of Classification Search ............ 365/185.17, 365/185.2, 185.21, 185.24, 18.18, 201  
See application file for complete search history.

(56) References Cited

U.S. PATENT DOCUMENTS 7,009,881 B2 * 3/2006 Noguchi ................. 365/185.17  
7,245,465 B2 * 7/2007 Hikita .......................... 361/18

FOREIGN PATENT DOCUMENTS

JP   2000-149577 A   5/2000

* cited by examiner

*Primary Examiner*—Hoai V Ho  
(74) *Attorney, Agent, or Firm*—Fujitsu Patent Center

(57) ABSTRACT

Nonvolatile evaluation memory cells are programmed to be a plurality of different values in advance, respectively. An internal voltage generating circuit can change the value of an internal voltage according to adjusting signals. To make the internal voltage close to its expected value, a voltage adjusting circuit outputs adjusting signals in accordance with cell currents that flow through the evaluation memory cells, respectively, in a read operation on the evaluation memory cells. As a result, the interval voltage that is shifted from its expected value due to variations in manufacturing conditions can automatically be set to the expected value by using the adjusting signals. Since an internal circuit operates on a correct internal voltage, operation margins can be increased. The yield of a nonvolatile semiconductor memory can thus be increased.

6 Claims, 8 Drawing Sheets

| WLE [V] | ~3.5 | 3.5~4.5 | 4.5~5.5 | 5.5~6.5 | 6.5~ |
|---|---|---|---|---|---|
| ADJ0 | L | H | H | H | H |
| ADJ1 | L | L | H | H | H |
| ADJ2 | L | L | L | H | H |
| ADJ3 | L | L | L | L | H |
| C1 | ON | OFF | OFF | OFF | OFF |
| C2 | ON | ON | OFF | OFF | OFF |
| C3 | ON | ON | ON | OFF | OFF |
| C4 | ON | ON | ON | ON | OFF |

Fig. 5

NONVOLATILE SEMICONDUCTOR MEMORY HAVING VOLTAGE ADJUSTING CIRCUIT

CROSS REFERENCE TO RELATED APPLICATION

This application is based upon and claims the benefit of priority from Japanese Patent Application No. 2005-348912, filed on Dec. 2, 2005, the entire contents of which are incorporated herein by reference.

BACKGROUND OF THE INVENTION

1. Field of the Invention

The present invention relates to a nonvolatile semiconductor memory having nonvolatile memory cells and word lines connected to the memory cells.

2. Description of the Related Art

Due to the miniaturization of semiconductor device structures, the insulator film of transistors has been thinning. To prevent reduction of the reliability of transistors, the power supply voltage supplied to a nonvolatile semiconductor memory such as a flash memory has been decreasing. Where an internal voltage (e.g., a high-level voltage of the word lines) used for accessing memory cells is higher than a power supply voltage, it is necessary to form, in the nonvolatile semiconductor memory, a boost circuit for generating an internal voltage by boosting the power supply voltage (e.g., Japanese Unexamined Patent Application Publication No. 2000-149577).

In general, a boost circuit generates a boosted voltage utilizing a switching operation of a transistor and coupling action of a capacitor. As a result, the boosted voltage varies depending on variations in a manufacturing process of a nonvolatile semiconductor memory. More specifically, the boosted voltage varies depending on the threshold voltage of the transistor, the thickness of an insulator film of the capacitor, and other factors. In particular, where the boost circuit operates only in accessing memory cells and a boosted voltage is generated by supplying a pulse signal to one end of the capacitor, it is difficult to finely adjust the boosted voltage through monitoring it. In this case, the boosted voltage is directly affected by variations in a manufacturing process.

For example, where the boosted voltage is used as a high-level voltage of the word lines, a variation in the voltage of the word lines narrows operation margins such as a read margin. This may lower the yield of the semiconductor memory to a large extent. Conventionally, to prevent variation of the voltage of the word lines, a technique is employed that the number of capacitors used for generating a boosted voltage is changed by switching photomasks for a wiring layer.

However, in this case, it is necessary to prepare plural kinds of photomasks. Further, patterns formed in a photomask are transferred to all chips on a wafer. This means a problem that the boosted voltage cannot be adjusted chip by chip. As a result, it is impossible to, generate an optimum boosted voltage for each chip. In other words, the effect of increasing the operation margins is not sufficient.

SUMMARY OF THE INVENTION

An object of the present invention is to increase operation margins of a nonvolatile semiconductor memory and thereby increase its yield.

According to a first aspect of the invention, nonvolatile evaluation memory cells are programmed in advance to be set to a plurality of different values, respectively. An internal voltage generating circuit generates an internal voltage to be used in an internal circuit. The internal voltage generating circuit can change the value of the internal voltage according to an adjusting signal. To make the internal voltage close to an expected value, a voltage adjusting circuit outputs, in a read operation on the evaluation memory cells, the adjusting signal in accordance with cell currents which flow through the respective evaluation memory cells. In general, with variations in manufacturing conditions of a semiconductor memory, the characteristics of constituent elements, such as transistors, of the semiconductor memory also vary. As a result, the internal voltage generated by the internal voltage generating circuit varies and cell currents flowing through the evaluation memory cells in a read operation also vary. Therefore, a variation in the interval voltage generated by the internal voltage generating circuit can be detected as variations in the cell currents. This makes it possible to automatically set the internal voltage shifted due to variations in manufacturing conditions to the expected value, by using an adjusting signal. Since the internal circuit operates on a correct internal voltage, operation margins can be increased. As a result, the yield of the nonvolatile semiconductor memory can be increased.

This makes it possible to automatically set the timing of the control signal shifted due to variations in manufacturing conditions to the expected timing by using an adjusting signal. Since the internal circuit operates with a control signal having correct timing, operation margins can be increased. As a result, the yield of the nonvolatile semiconductor memory can be increased.

BRIEF DESCRIPTION OF THE DRAWINGS

The nature, principle, and utility of the invention will become more apparent from the following detailed description when read in conjunction with the accompanying drawings in which like parts are designated by identical reference numbers, in which:

FIG. 5 is an explanatory table showing how the evaluation sense amplifier of FIG. 2 and the boost circuit of FIG. 4 operate;

DESCRIPTION OF THE PREFERRED EMBODIMENTS

Figure 1:
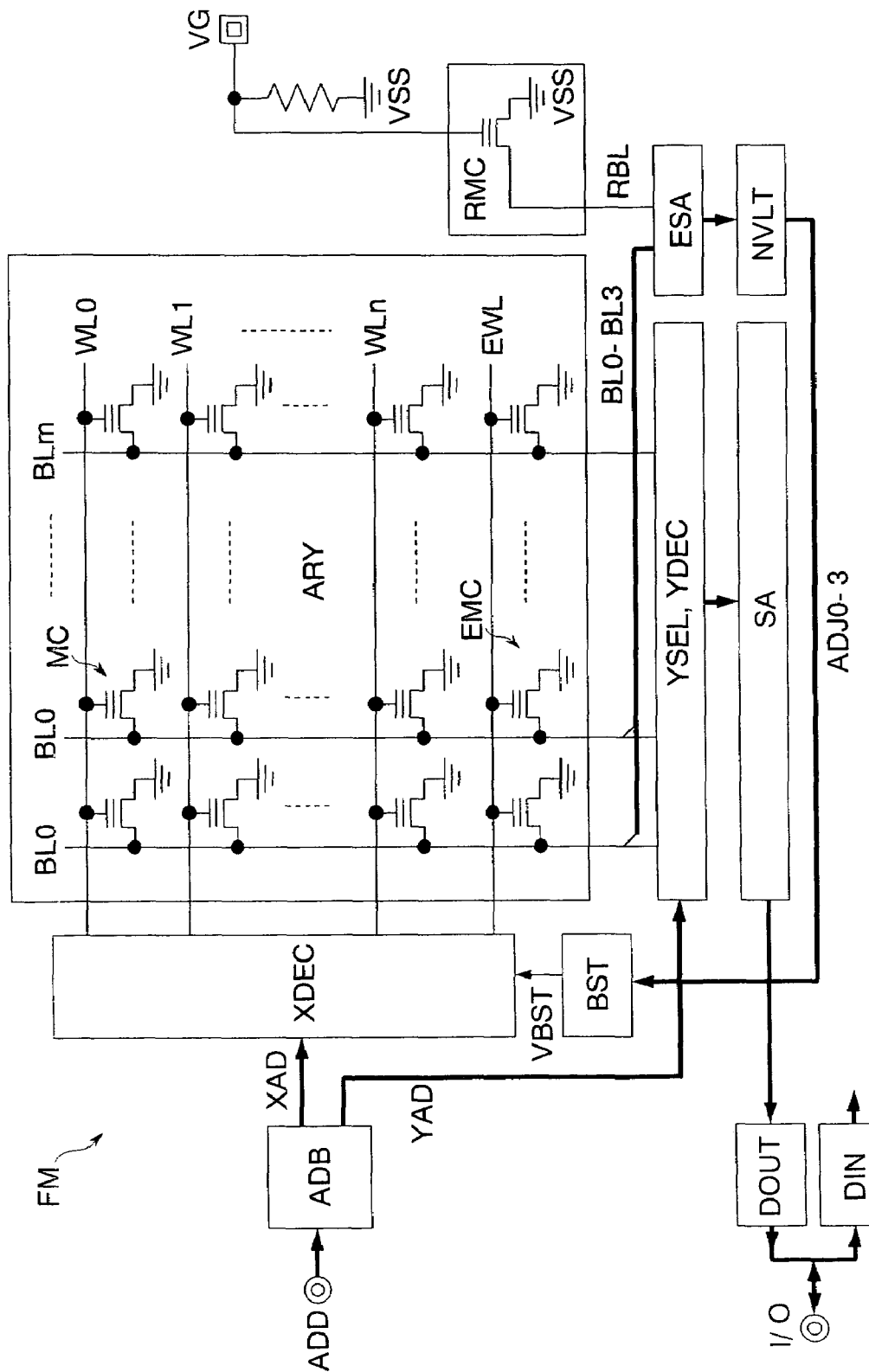
FIG. 1 is a block diagram showing a first embodiment of the present invention.

Embodiments of the present invention will be hereinafter described with reference to the drawings. In the drawings, a signal line drawn as a thick line actually consists of a plurality of lines. Part of blocks to which a thick-line signal line is connected each consist of a plurality of circuits. A signal line which transmits a signal is given a symbol that is the same as the name of the signal.

FIG. 1 shows a nonvolatile semiconductor memory according to a first embodiment of the invention. This nonvolatile semiconductor memory is a NOR flash memory FM which has electrically rewritable nonvolatile memory cells and is manufactured on a silicon substrate by a CMOS process.

The flash memory FM has an address buffer ADB, a data input buffer DIN, a data output buffer DOUT, a boost circuit BST (internal voltage generating circuit), a word decoder XDEC, a memory cell array ARY, a column decoder YDEC, a column selector YSEL, a sense amplifier SA, an evaluation sense amplifier ESA (voltage adjusting circuit), a nonvolatile latch NVLT (nonvolatile memory circuit), and a reference memory cell RMC.

The address buffer ADB receives an address signal AD via an address terminal AD and outputs the received address AD as a row address signal XAD and a column address signal YAD. The row address signal XAD consists of higher bits of the address signal AD. The row address signal XAD is used for a selection from word lines WL (WL0-WLn; described later). The column address signal YAD consists of lower bits of the address signal AD. The column address signal YAD is used for a selection of a predetermined number of memory cells MC which are connected to a word line WL.

The data input buffer DIN receives write data via a data terminal I/O. The data output buffer DOUT outputs, to the data terminal I/O, read data which are read from the cell array ARY. The data terminal I/O is of 16 bits, for example.

The boost circuit BST receives adjusting signals ADJ0-3 (described later), and generates one of a plurality of boosted voltages VBST (internal voltages) in accordance with logical levels of the adjusting signals ADJ0-3. As described later, the boost circuit BST is kick-started so as to be timed with activation of a word line WL or an evaluation word line EWL.

The word decoder XDEC activates one of the word lines WL0-WLn to a high-voltage level according to a row address signal XAD in a read operation or a write operation of a normal operation mode. During a test-mode operation, the word decoder XDEC prohibits activation of the word lines WL0-WLn and activates the evaluation word line EWL to the high-voltage level in a predetermined period in synchronism with a test command. The word decoder XDEC operates as a test circuit which activates the evaluation word line EWL during the test-mode operation and prohibits activation of the evaluation word line EWL during a normal-operation-mode operation. Prohibiting activation of the evaluation word line EWL during a normal-operation-mode operation makes it possible to prevent a malfunction such as a multi-selection of word lines WL and EWL and thereby increase the reliability of the flash memory FM.

For example, the operation state of the flash memory FM makes a transition from the normal operation mode to the test mode when a predetermined voltage is received by a test pad (not shown). The boosted voltage VBST is used as a high-level voltage for the word lines WL0-WLn and the evaluation word line EWL. That is, the word decoder XDEC is an internal circuit which uses the boosted voltage VBST (internal voltage).

The memory cell array ARY has a plurality of nonvolatile normal memory cells MC which are arranged in matrix form, the word lines WL0-WLn each of which is connected to memory cells MC arranged in the horizontal direction in FIG. 1, and bit lines BL0-BLm each of which is connected to memory cells MC arranged in the vertical direction in FIG. 1, the evaluation word line EWL which extends adjacent to and parallel with the word line WLn, and a plurality of evaluation memory cells EMC which are arranged in the horizontal direction in FIG. 1 and connected to the evaluation word line EWL. The memory cell array ARY has an array structure commonly called the NOR type.

Figure 2:
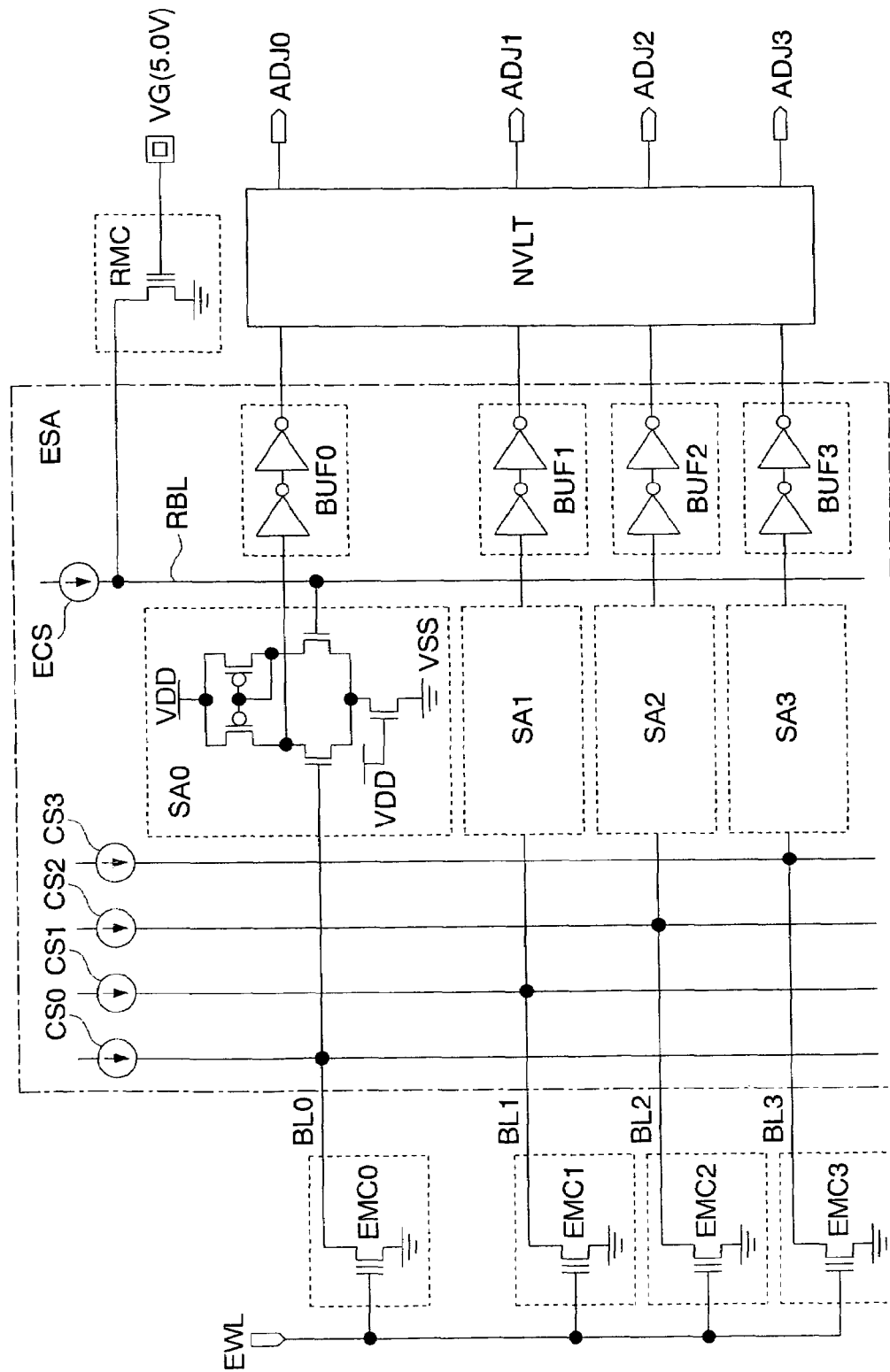
FIG. 2 is a circuit diagram showing the details of an evaluation sense amplifier shown in FIG. 1.

Like the normal memory cells MC, the evaluation memory cells EMC are connected to the respective bit lines BL0-BLm. In this embodiment, as shown in FIG. 2 (referred to for a later description), the evaluation memory cells EMC0-3 (these reference symbols are not shown) which are connected to the bit lines BL0-BL3 are used in the test-mode operation. The evaluation memory cells EMC4-EMCm which are connected to the bit lines BL4-BLm are not used.

Each of the memory cells MC and EMC is a cell transistor (nMOS transistor) having a floating gate and a control gate which is connected to a word line WL or EWL. The floating gate is made of polysilicon or the like and is conductive. The drain of the cell transistor is connected to one of the bit lines BL0-BLm. The source of the cell transistor is connected to a ground line.

Forming the evaluation memory cells EMC0-3 in the memory cell array ARY together with the normal memory cells MC makes it possible to make the electric characteristics of the evaluation memory cells EMC0-3 the same as those of the normal memory cells MC. That is, the evaluation of cell currents using the evaluation memory cells EMC0-3 is equivalent to that using normal memory cells MC. Therefore, operation margins can be increased reliably by feeding back adjusting signals ADJ0-3 indicating evaluation results to the boost circuit BST.

The memory cells MC and EMC are electrically rewritable nonvolatile memory cells having the same structure. The column decoder YDEC generates a column decoding signal (not shown) according to a column address YAD in a read operation of the normal operation mode. The column selector YSEL connects a predetermined number of (e.g., eight which is the same as the number of data terminals I/O) bit lines BL0-BLm (i.e., part of the bit lines BL0-BLm) to the sense amplifier SA according to a column decoding signal in a read operation of the normal operation mode. Activated in a read operation, the sense amplifier SA amplifies data signals that have been read to bit lines BL and outputs the amplified data signals to the data output buffer DOUT.

The evaluation sense amplifier ESA and the nonvolatile latch NVLT operate in synchronism with a test command in the test-mode operation. The evaluation sense amplifier ESA amplifies data signals that have been read from the evaluation memory cells EMC0-3 to the bit lines BL0-BL3, and outputs the amplified data signals to the nonvolatile latch NVLT as a binary logical signal. The nonvolatile latch NVLT has electrically rewritable nonvolatile memory cells and latches connected to the memory cells. The nonvolatile latch NVLT stores the value of the logical signal that is output from the evaluation sense amplifier ESA and outputs the stored logical value as adjusting signals ADJ0-3.

The reference memory cell RMC has a cell transistor having the same structure as the normal memory cells MC. The cell transistor of the reference memory cell RMC is such that the gate is connected to an evaluation pad VG, the source is connected to the ground line, and the drain is connected to an input of the evaluation sense amplifier ESA via an evaluation bit line RBL. The evaluation pad VG is connected to the ground line VSS via a high-resistance resistor. The evaluation pad VG is a pad for evaluation which is formed on the chip of the flash memory FM. The reference memory cell RMC may be formed in the cell array ARY.

Although not shown in any figures, the flash memory FM has a command input circuit for receiving an operation command externally, a command decoder for decoding the operation command, a state machine for generating a timing signal, a write circuit for supplying a write data signal to the cell array ARY, and other circuits.

FIG. 2 shows the details of the evaluation sense amplifier ESA shown in FIG. 1. The evaluation sense amplifier ESA has differential sense amplifiers SA0-SA3 which correspond to the respective evaluation memory cells EMC0-EMC3, buffer circuits BUF0-BUF3 which are connected to the outputs of the sense amplifiers SA0-SA3, respectively, and constant current sources CS0-CS3 and RCS which are connected to the bit lines BL0-BL3 and the reference bit line RBL, respectively.

The sense amplifiers SA0-SA3 have the same structure. Each of the sense amplifiers SA0-SA3 has a pair of pMOS transistors which constitute a current mirror circuit, a pair of nMOS transistors whose gates are connected to one of the bit lines BL0 (or BL1-3) and the reference bit line RBL, respectively, and an nMOS transistor for current adjustment which is connected to the sources of the pair of nMOS transistors.

The inputs of the buffer circuits BUF0-BUF3 are connected to the outputs of the sense amplifiers SA0-SA3 (i.e., the drains of the nMOS transistors that are connected to the bit lines BL0-BL3), respectively. Each of the buffer circuits BUF0-BUF3 is a connection of a pair of inverter circuits.

Figure 3:
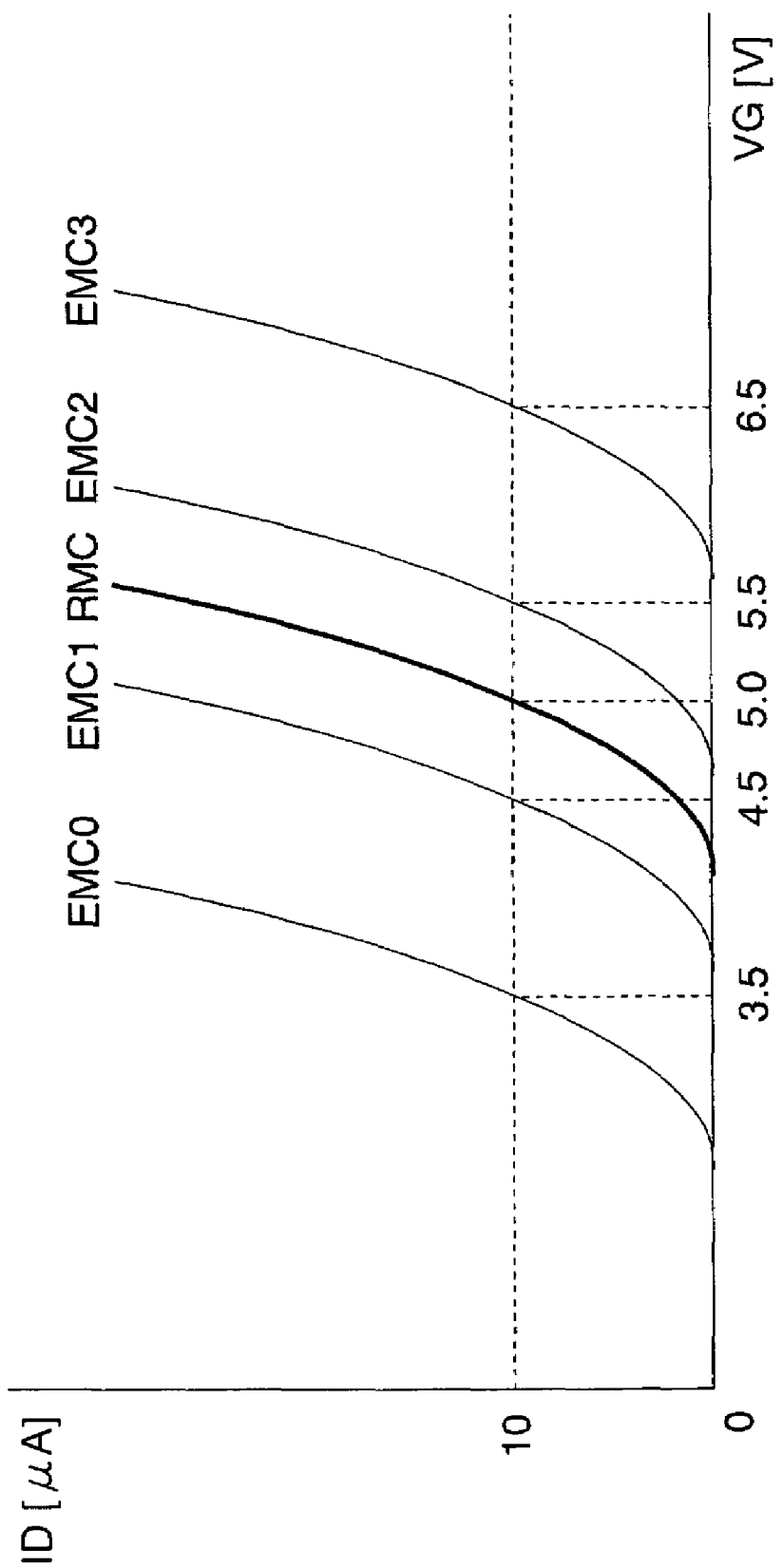
FIG. 3 is an explanatory graph showing electric characteristic of evaluation memory cells and a reference memory cell shown in FIG. 2.

FIG. 3 shows electric characteristics of the evaluation memory cells EMC0-EMC3 and the reference memory cell RMC. The threshold voltages of the evaluation memory cells EMC0-EMC3 and the reference memory cell RMC are set in advance at 3.5 V, 4.5 V, 5.5 V, 6.5 V, and 5.0 V, respectively. In this embodiment, the threshold voltage is defined as a gate voltage at which the drain-to-source current (i.e., cell current) amounts to 10 µA when the drain voltage is 0.1 V.

The threshold voltages of the memory cells EMC0-EMC3 and RMC are set by performing write operations (program operations) on the memory cells EMC0-EMC3 being in an erased state in a manufacturing process (test process) of the flash memory FM. The erased state is a state that the threshold voltage is low (e.g., 0 V). The threshold voltage of each of the memory cells EMC0-EMC3 and RMC is increased by a write operation. For example, the write operation is an operation of injecting hot electrons into the floating gate or an operation of injecting electrons into the floating gate by FN tunneling.

Figure 4:
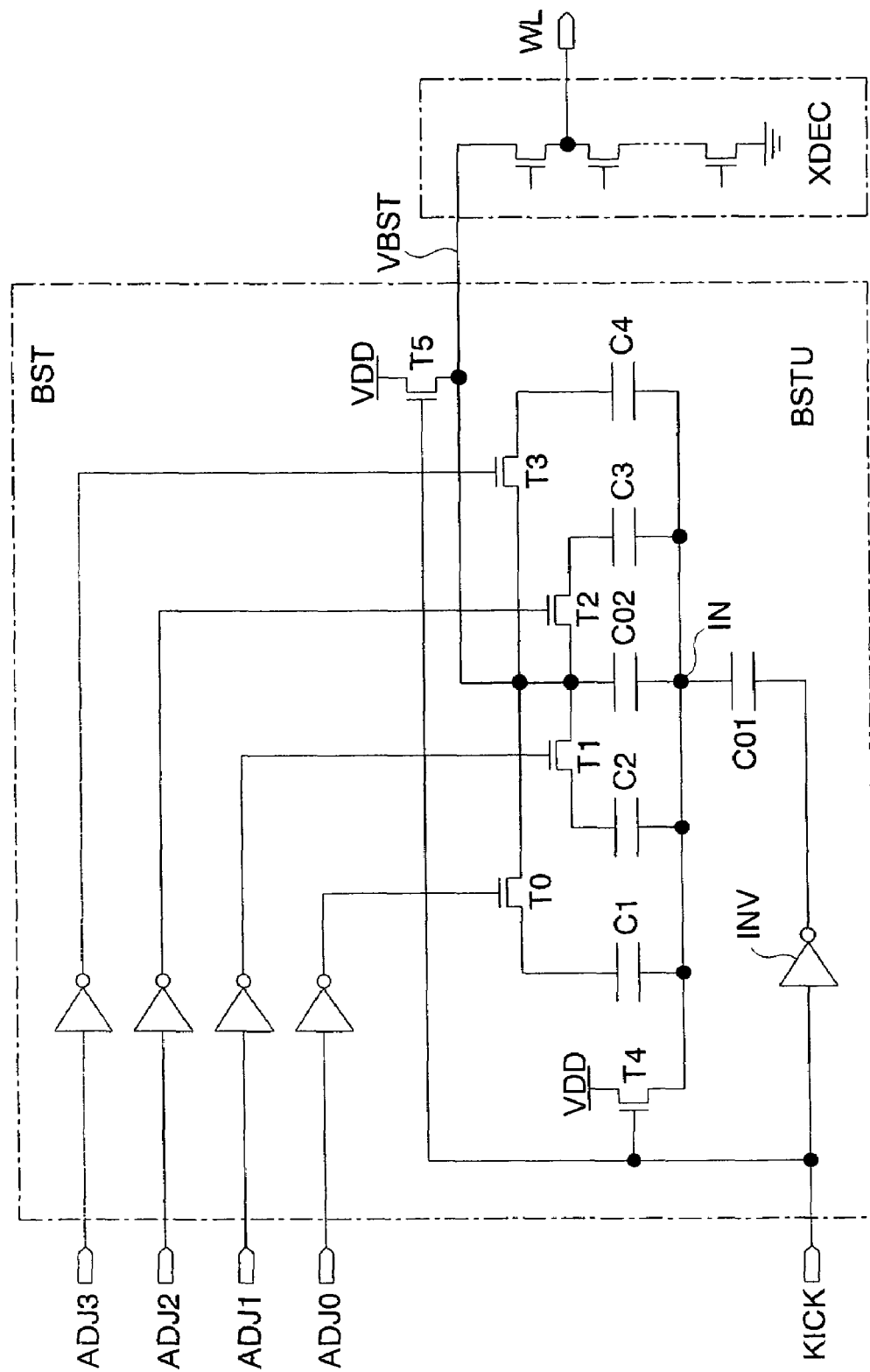
FIG. 4 is a circuit diagram showing the details of a boost circuit shown in FIG. 1.

FIG. 4 shows the details of the boost circuit BST shown in FIG. 1. The boost circuit BST has an inverter INV for inverting a kick signal KICK which is a trigger signal for a boosting operation, a series connection of capacitors C01 and C02 which are provided between the output of the inverter INV and a boost node VBST, capacitors C1-C4 which are connected to the capacitor C02 in parallel, nMOS transistors T0-T3 which connect one ends of the capacitors C1-C4 to the boost node VBST, an nMOS transistor T4 for setting the voltage of an input node IN of the capacitors to a power supply voltage VDD, and an nMOS transistor T5 for setting the voltage of the boost node VBST to the power supply voltage VDD. The gates of the nMOS transistors T0-T3 receive a reversal signal of adjusting signals ADJ0-3 via inverters, respectively.

In the boost circuit BST, when the kick signal KICK is at a high level, the output voltage of the inverter INV is set to a low level (VSS) and the voltages of the input node IN and the boost node VBST are set to a high level (VDD). In synchronism with a change of the kick signal KICK to a low level, the input node IN and the boost node VBST are set to a floating state and the output voltage of the inverter INV is changed to the high level (VDD). As a result, a boosted voltage VBST which is higher than the power supply voltage VDD is generated through coupling capacitance action of the capacitors C01 and C02. The kick signal KICK is changed from the high level to the low level in synchronism with a read command or a write command which is supplied from the outside of the flash memory FM, that is, a little before a word line WL is selected by the word decoder XDEC.

When at least one of adjusting signals ADJ0-3 is at the low level and hence at least one of the capacitors C1-C4 is connected to the boost node VBST, the coupling capacitance action is enhanced. The drivability of the boost circuit BST increases in proportion to the number of capacitors (part of the capacitors C1-C4) connected to the boost node VBST.

The increasing speed of the boosted voltage VBST increases in proportion to the number of capacitors (part of the capacitors C1-C4) connected to the boost node VBST. Therefore, the boosted voltage at an instant of selection of a word line increases in proportion to the number of capacitors (part of the capacitors C1-C4) connected to the boost node VBST.

FIG. 5 shows how the evaluation sense amplifier ESA of FIG. 2 and the boost circuit BST of FIG. 4 operate. In a test process, first, threshold voltages of the memory cells EMC0-EMC3 and RMC are set. Then, when, for example, a voltage higher than the power supply voltage VDD is applied to the test pad of the flash memory FM, the operation state of the flash memory FM makes a transition from the normal operation mode to the test mode.

During the test-mode operation, 5 V is supplied to the evaluation pad VG and the gate voltage of the reference memory cell RMC is set at 5 V. As a result, a cell current of 10 µA flows through the reference memory cell RMC throughout the test-mode operation. There may be formed a circuit for connecting the gate of the reference memory cell RMC to an external power supply voltage line during the test-mode operation if a voltage supplied to the evaluation pad VG is equal to an external power supply voltage that is supplied to a power supply terminal. In this case, the evaluation pad VG is not necessary.

For example, the supply of a voltage to the test pad or the evaluation pad VG is performed by bringing a probe into contact with the flash memory FM being in a wafer state by using an LSI tester. Then, a test command is supplied from the LSI tester to the flash memory FM. The row decoder XDEC activates the evaluation word line EWL to the high-voltage level in a predetermined period in response to the test command. The high-level voltage of the evaluation word line EWL is equal to the boosted voltage VBST generated by the boost circuit BST. And the high-level voltage of the evaluation word line EWL is equal to that of the normal word lines WL.

A read operation is performed on the evaluation memory cells EMC0-EMC3 in a period when the evaluation word line EWL is at the high level. In this embodiment, the expected value (design value) of the boosted voltage VBST is 5 V. However, the boosted voltage VBST may deviate from the expected value because of variations in the manufacturing conditions of the semiconductor manufacturing process. The deviation from the expected value also depends on the chip position in a wafer. Therefore, there may occur a case that the high-level voltage of the evaluation word line EWL and the normal word lines WL deviates from the expected value to a large extent. In this embodiment, a voltage of the evaluation word line EWL is measured indirectly and a measurement result is fed back to the boost circuit BST, whereby the boosted voltage VBST can be made equal to its expected value even if a manufacturing condition is fluctuated.

For example, if the voltage of evaluation word line EWL is lower than 3.5 V, as shown in FIG. 3 the cell currents ID of all the evaluation memory cells EMC0-3 are smaller than 10 μA. And the cell current of the reference memory cell RMC is 10 μA. Therefore, all the sense amplifiers SA0-3 output the low logical level and the nonvolatile latch NVLT outputs adjusting signals ADJ0-3 of the low logical level (L). In the boost circuit BST of FIG. 4, the transistors T1-T4 which are connected to the capacitors C1-C4 are turned on (ON) according to the adjusting signals ADJ0-3. As a result, the capacitance of the capacitor connected to the output node of the boosted voltage VBST is maximized and the drivability of a kick operation is made highest. Since the increasing speed of the boosted voltage VBST in a kick operation is made highest, the voltage of a word line WL or EWL at an instant of reading on memory cells MC or EMC can be made sufficiently high. More specifically, the high-level voltage of the word line WL or EWL can be set approximately equal to 5 V which is the expected value.

If the voltage of the evaluation word line EWL is higher than or equal to 3.5 V and lower than 4.5 V, as shown in FIG. 3 the cell current ID of only the evaluation memory cell EMC0 is larger than 10 μA and the cell currents ID of the other evaluation memory cells EMC1-3 are smaller than 10 μA. Therefore, the sense amplifier SA0 outputs the high logical level and the sense amplifiers SA1-3 output the low logical level. The nonvolatile latch NVLT outputs an adjusting signal ADJ0 of the high logical level (H) and adjusting signals ADJ1-3 of the low logical level (L). In the boost circuit BST, according to the adjusting signals ADJ0-3, the transistor T1 which is connected to the capacitor C1 is turned off (OFF) and the transistors T2-T4 which are connected to the capacitors C2-C4 are turned on (ON). As a result, the capacitance of the capacitor connected to the output node of the boosted voltage VBST is made second largest and the drivability of a kick operation is made second highest. The high-level voltage of a word line WL or EWL is set approximately equal to the expected value (5V).

Likewise, if the voltage of the evaluation word line EWL is higher than or equal to 4.5 V and lower than 5.5 V, the nonvolatile latch NVLT outputs adjusting signals ADJ0 and ADJ1 of the high logical level (H) and adjusting signals ADJ2 and ADJ3 of the low logical level (L). In the boost circuit BST, according to the adjusting signals ADJ0-3, the transistors T1 and T2 which are connected to the capacitor C1 and C2 are turned off (OFF) and the transistors T3 and T4 which are connected to the capacitors C3 and C4 are turned on (ON).

If the voltage of the evaluation word line EWL is higher than or equal to 5.5 V and lower than 6.5 V, the nonvolatile latch NVLT likewise outputs adjusting signals ADJ0-2 of the high level (H) and an adjusting signal ADJ3 of the low level (L) according to the voltage of the evaluation word line EWL. Only the capacitor C4 is connected to the input node IN and the boost node VBST. If the voltage of the evaluation word line EWL is higher than or equal to 6.5 V, none of the capacitors C1-C4 are connected to the boost node VBST. Therefore, a boosted voltage VBST is generated by using only the capacitors C01 and C02.

Where the voltage of the evaluation word line EWL is higher than or equal to 5.5 V, the capacitance of the capacitor connected to the boost node VBST is relatively small and hence the drivability of a kick operation is low. Since the increasing speed of the boosted voltage VBST in a kick operation is decreased, the voltage of a word line WL or EWL at an instant of reading on memory cells MC or EMC can be lowered. More specifically, the high-level voltage of the word line WL or EWL can be set approximately equal to 5V which is the expected value.

In general, when the high-level voltage of the word lines WL is low, there is a probability that correct data cannot be read from memory cells MC, that is, the read margin is reduced. A reduction in the read margin means a reduction in the yield of the flash memory FM, which leads to an increase in manufacturing cost. On the other hand, when the high-level voltage of the word lines WL is high, the control gate of each memory cell MC receives a high voltage in each read operation. As a result, a phenomenon may occur that the electrons injected in the floating gate of each memory cell MC disappear gradually and the threshold voltage decreases accordingly (a reduction in the disturb margin). The reduction in the threshold voltage also occurs not only in memory cells MC from which data are read but also non-accessed memory cells MC that are connected to the same word line WL to which the memory cells MC from which data are read are connected. Therefore, when the high-level voltage of the word lines WL is high, the reliability of data held by the memory cells MC may decrease.

In this embodiment, the high-level voltage of the word lines WL can always be set to a normal value (approximately equal to 5V) even if the manufacturing conditions of the flash memory FM vary. This makes it possible to prevent reduction of the read and write margins and hence reduction of the yield. As a result, increase of the manufacturing cost can be prevented. Further, reduction of the disturb margin can be prevented and hence the reliability can be increased.

The logical levels of the adjusting signals ADJ0-3 are stored in the nonvolatile latch NVLT. Therefore, even after cancellation of the test-mode operation, the on/off states of the transistors T1-T4 are maintained. Further, the nonvolatile latch NVLT holds the logical levels of the adjusting signals ADJ0-3 even after power-off of the flash memory FM.

Therefore, when the flash memory FM is powered on again, the transistors T1-T4 are turned on or off in the same manner as before. Therefore, the boosted voltage VBST can automatically be set to its expected value each time by causing the evaluation sense amplifier ESA to operate in the test mode only once after manufacture of the flash memory FM. Further, the boosted voltage VBST can be set to an optimum value for each chip.

As described above, according to the first embodiment, the boosted voltage VBST that is shifted from the expected value due to variations in the manufacturing conditions can automatically be set to the expected value by using the adjusting signals ADJ0-3. Since the word decoder XDEC operates on a correct boosted voltage VBST irrespective of variations in the manufacturing conditions, the read margin and the write margin of the memory cells MC can be increased and the yield can be increased accordingly.

Adjusting signals ADJ0-3 of a plurality of bits can be generated easily by letting the evaluation sense amplifier ESA compare cell currents flowing through the evaluation memory cells EMC0-3 with a cell current flowing through the reference memory cell RMC. That is, the operation margins can be increased by a simple circuit.

The logical value of adjusting signals ADJ0-3 is held by the nonvolatile latch NVLT even after power-off. Therefore, if the evaluation sense amplifier ESA is once caused to operate in a manufacturing process of the flash memory FM, it is no longer necessary to adjust a boosted voltage BVST thereafter. The usability of the flash memory FM can be increased because a user need not pay attention to such things as the test mode for adjustment of a boosted voltage VBST.

For example, the evaluation memory cells EMC are formed in the cell array ARY together with the normal memory cells MC. With this measure, the electric characteristics of the evaluation memory cells EMC can be made equal to those of the normal memory cells MC. That is, evaluation results of cell currents obtained by using the evaluation memory cells EMC are equivalent to those obtained by using normal memory cells MC. As a result, operation margins can be increased reliably by feeding back the adjusting signal ADJ0-3 indicating evaluation results to the boost circuit BST.

For example, the evaluation word line EWL is activated by the word decoder XDEC (test circuit) during a test mode, and is prohibited from being activated during a normal operation mode. Since the evaluation word line EWL is not activated during a normal operation mode, a malfunction such as a multi-selection of word lines can be prevented and hence the reliability of the flash memory FM can be improved.

Figure 6:
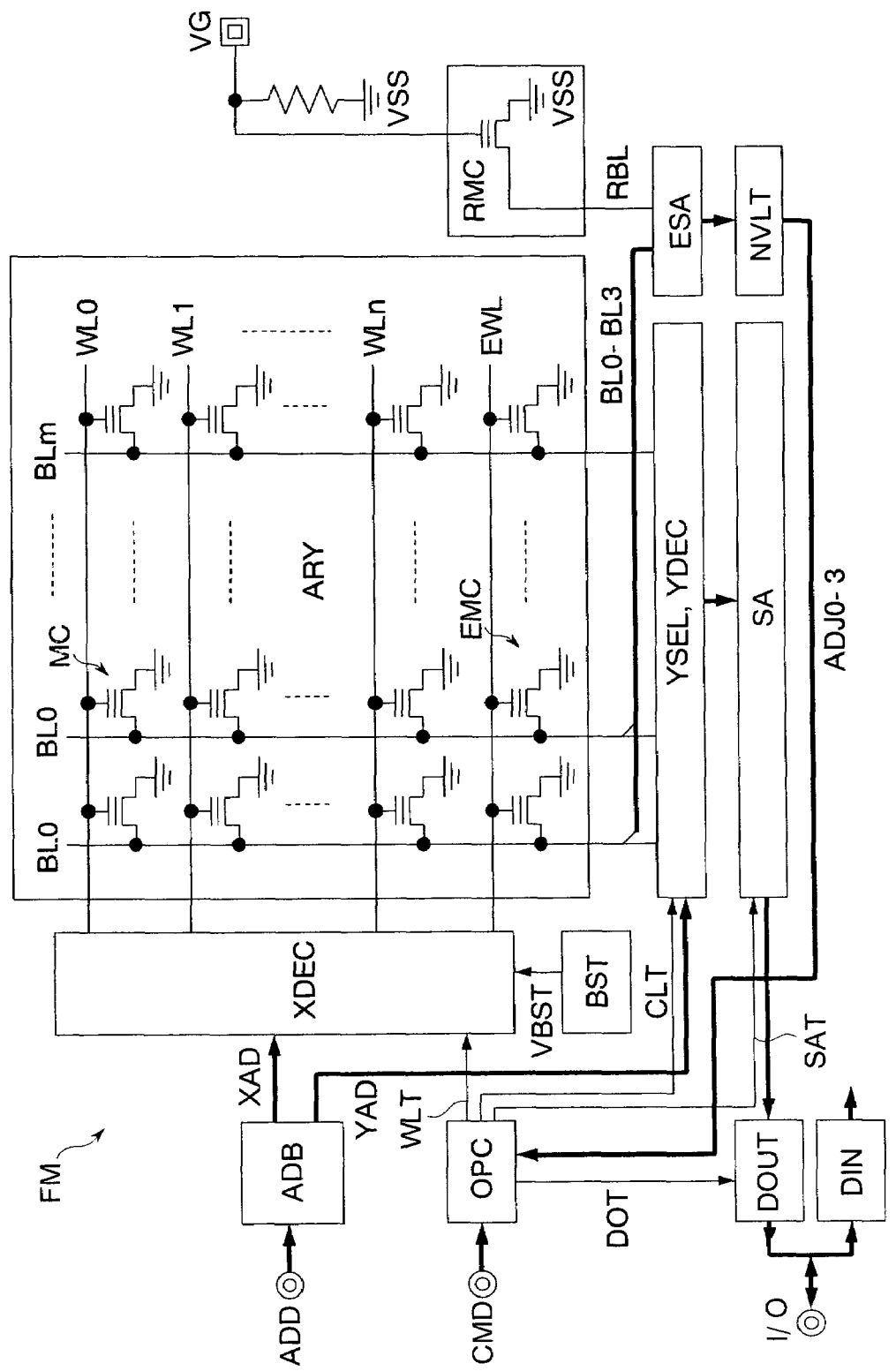
FIG. 6 is a block diagram showing a second embodiment of the invention.

FIG. 6 shows a second embodiment of the invention. The same elements as described in the first embodiment will be given the same reference symbols as in the first embodiment and will not be described in detail. In this embodiment, adjusting signals ADJ0-3 which are output from the nonvolatile latch NVLT are supplied to an operation control circuit OPC (internal signal generating circuit) rather than the boost circuit BST. The operation control circuit OPC receives, via a command terminal CMD, operation commands (read command, write command, erase command, test command, etc.) for operation of the flash memory FM. The operation control circuit OPC decodes a received operation command and outputs timing signals for controlling operation of the word decoder XDEC, the sense amplifier SA, the data output buffer DOUT, etc. The evaluation sense amplifier ESA operates as a timing adjusting circuit which outputs adjusting signals ADJ0-3 in accordance with cell currents which flow through the evaluation memory cells EMC in read operations on the evaluation memory cells EMC. The other part of the configuration is the same as in the first embodiment. That is, the word decoder XDEC operates as the test circuit which activates the evaluation word line EWL during a test-mode operation and prohibits activation of the evaluation word line EWL during a normal-operation-mode operation.

For example, the operation control circuit OPC outputs, to the word decoder XDEC, a word timing signal WLT which determines activation timing of word lines WL and EWL. Likewise, the operation control circuit OPC outputs a column timing signal CLT which determines on-timing of column switches (not shown) in the column selector YSEL, a sense amplifier timing signal SAT which determines activation timing of the sense amplifier SA, and a data output timing signal DOT which determines data output timing of the data output buffer DOUT. When a column switch is turned on, the associated bit line is connected to the sense amplifier SA. The operation control circuit OPC changes the timing of generation of the column timing signal CLT, the sense amplifier timing signal SAT, and the data output timing signal DOT according to the adjusting signals ADJ0-3.

The column timing signal CLT, the sense amplifier timing signal SAT, and the data output timing signal DOT are read timing signals which determine read timing of data to be read from the normal memory cell MC. The column decoder YDEC, the column selector YSEL, the sense amplifier SA, and the data output buffer DOUT are internal circuits which operate according to the control signals CLT, SAT, and DOT.

When a logical value indicated by adjusting signals ADJ0-3 is small, that is, when it is detected in the test-mode operation that a high-level voltage of the evaluation word line EWL is low, the operation control circuit OPC delays the timing of generation of timing signals CLT, SAT, and DOT. Conversely, when a logical value indicated by adjusting signals ADJ0-3 is large, that is, when it is detected in the test-mode operation that a high-level voltage of the evaluation word line EWL is high, the operation control circuit OPC advances the timing of generation of timing signals CLT, SAT, and DOT.

The high-level voltage of the word lines WL and EWL is generated by the boost circuit VBST. Therefore, when the high-level voltage of the evaluation word line EWL is low, the high-level voltage of a word line WL also becomes low. In this case, the output timing of data that are read from the memory cells MC to the bit lines BL0-BLm becomes late. Therefore, delaying the timing of generation of timing signals CLT, SAT, and DOT prevents reading of erroneous data. On the other hand, when the high-level voltage of a word line WL is high, the output timing of data that are read from the memory cells MC to the bit lines BL0-BLm becomes early. Therefore, advancing the timing of generation of timing signals CLT, SAT, and DOT prevents reading of erroneous data. Therefore, adjusting the timing of generation of timing signals WLT, CLT, SAT, and DOT in accordance with the voltage of the evaluation word line EWL makes it possible to increase the read margin and hence the yield of the flash memory FM.

Figure 7:
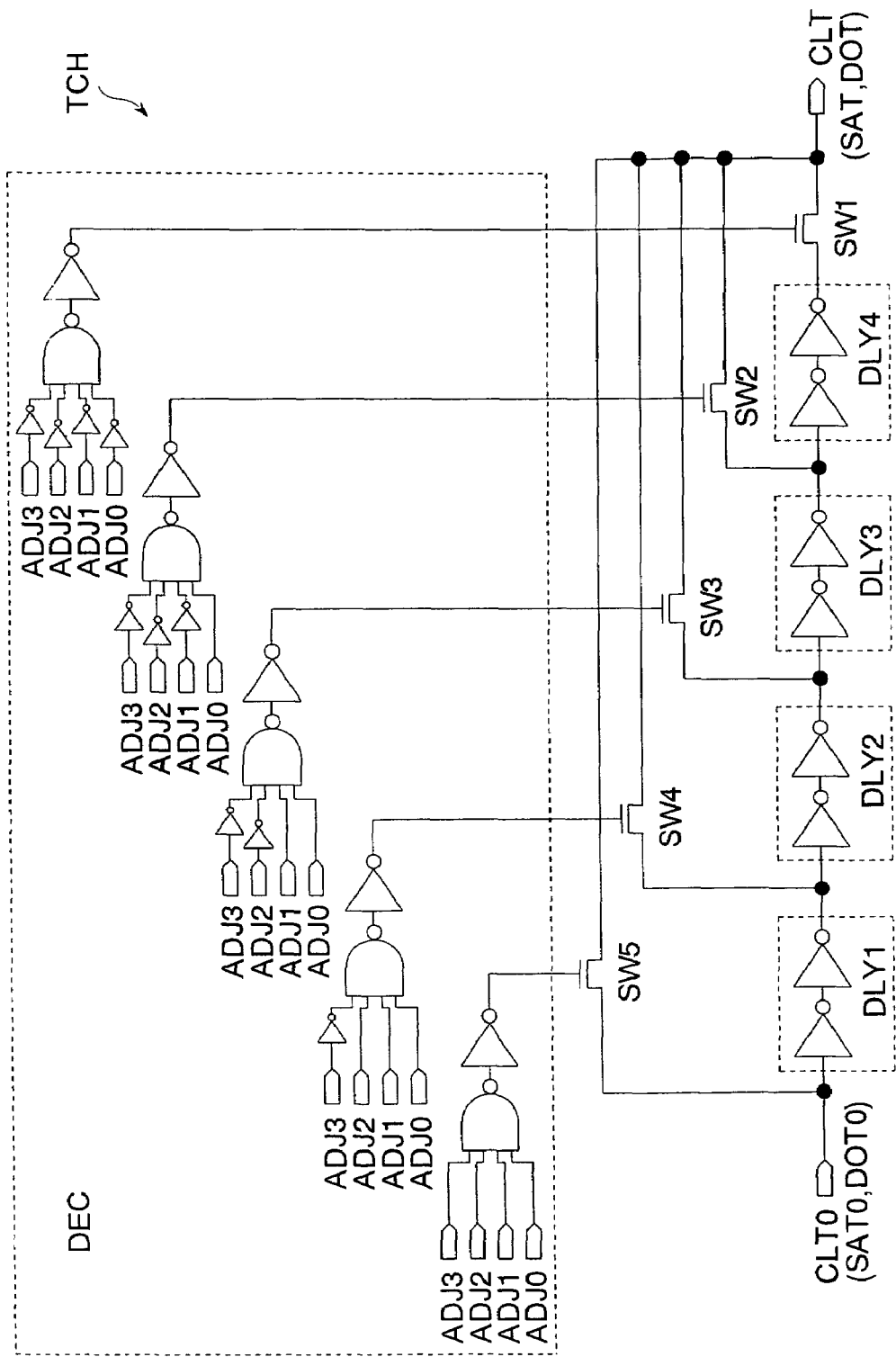
FIG. 7 is a circuit diagram showing the details of an internal timing adjusting circuit shown in FIG. 6.

FIG. 7 shows a timing changing circuit TCH which is provided in the operation control circuit OPC shown in FIG. 6 and serves to change the timing of generation of a timing signal CLT. Timing changing circuits TCH for changing the timing of generation of timing signals SAT and DOT are the same as the circuit of FIG. 7 except that the delay times of delay circuits DLY1-DLY4 are different than in the circuit of FIG. 7.

The timing changing circuit TCH has a series connection of delay circuits DLY1-DLY4, switches SW1-SW5 (nMOS transistors) which connect the outputs of the delay circuits DLY1-DLY4 and the input of the delay circuit DLY1 to an output node of the timing signal CLT, and a decoder DEC which turns on part of the switches SW1-SW5 according to adjusting signals ADJ0-3. The input of the timing changing circuit TCH receives a timing signal CLT0 which is generated in the operation control circuit OPC.

As described above with reference to FIG. 5, the number of adjusting signals of the high level (H) (i.e., part of the adjusting signals ADJ0-3) increases as the voltage of the evaluation word line EWL increases. As the number of high-level adjusting signals increases, the number of delay circuits DLY used decreases and the timing of generation of a timing signal CLT becomes earlier.

As described above, the second embodiment provides advantages similar to the advantages of the first embodiment. In general, with variations in manufacturing conditions of a semiconductor memory, the characteristics of constituent elements, such as transistors, of the semiconductor memory also vary. As a result, the timing for generation of the timing signals CLT, SAT, DOT used in the internal circuit varies and cell currents flowing through the evaluation memory cells EMC0-3 in a read operation also vary. Therefore, a variation in the timing of the timing signals CLT, SAT, DOT can be detected from variations in the cell currents. Therefore, the timing of generation of timing signals CLT, SAT, and DOT that is sifted due to variations in the manufacturing conditions can automatically be set to expected timing by using the adjusting signals ADJ0-3. As a result, the operation margins can be increased and the yield can be increased accordingly.

For example, the evaluation word line EWL is activated during a test mode by the word decoder XDEC (test circuit), and is prohibited from being activated during a normal operation mode. Since the evaluation word line EWL is not activated during a normal operation mode, a malfunction such as a multi-selection of word lines can be prevented and hence the reliability of the flash memory FM can be increased.

Figure 8:
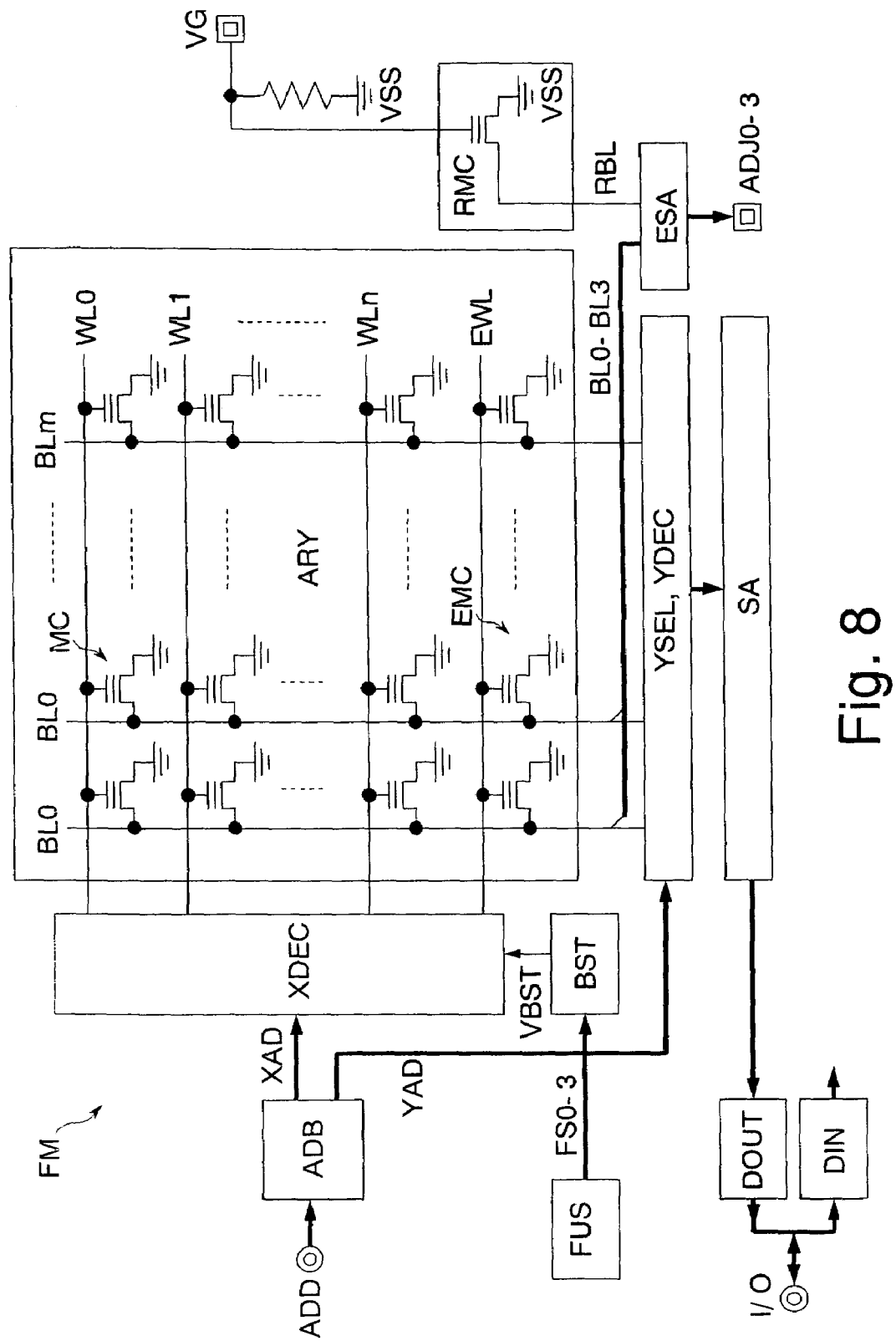
FIG. 8 is a block diagram showing a third embodiment of the invention.

FIG. 8 shows a third embodiment of the invention. The same elements as described in the first embodiment will be given the same reference symbols as in the first embodiment and will not be described in detail. This embodiment is different from the first embodiment in that adjustment pads ADJ0-3 are formed in place of the nonvolatile latch NVLT and a fuse circuit FUS is newly formed. The boost circuit BST operates receiving fuse signals FS0-3 instead of the adjusting signals ADJ0-3 of the first embodiment. The other part of the configuration is the same as in the first embodiment.

The fuse circuit FUS has fuses (not shown) corresponding to the respective fuse signals FS0-3. For example, the fuses are made of polysilicon. Each of the fuse signals FS0-3 is given a low logical level if the corresponding fuse is cut, and is given a high logical level if the corresponding fuse is not cut.

In this embodiment, in the test-mode operation, adjusting signals ADJ0-3 which are generated according to a high-level voltage of the evaluation word line EWL are output to an evaluation apparatus such as an LSI tester via the external terminals ADJ0-3. In a test process of the flash memory FM, the fuse circuit FUS is programmed in accordance with the logical levels of the adjusting signals ADJ0-3 that have been output to the evaluation apparatus. More specifically, the fuse circuit FUS thus programmed outputs fuse signals FS0-3 having the same logical levels as those of the adjusting signals ADJ0-3, respectively. Therefore, a boosted voltage VBST generated by the boost circuit BST is the same as in the first embodiment.

As described above, the third embodiment provides the same advantages as the first embodiment does. Further, since the nonvolatile latch NVLT is not necessary, no control circuit for programming the nonvolatile latch NVLT is necessary. In particular, where the flash memory FM has redundancy circuits for relief from failures and a fuse circuit for selecting from the redundancy circuits, a fuse programming process can also be used for programming of the fuse circuit FUS.

In the above embodiments, the invention is applied to the boost circuit to automatically adjust the high-level voltage (boosted voltage) of the word lines WL.

However, where the low-level voltage (reset voltage) of the word lines WL is a negative voltage, the invention may applied to a negative voltage generating circuit for generating a negative voltage. As a further modification, another internal voltage such as a high-level voltage of the sense amplifier may be adjusted automatically according to the invention.

In the above embodiment, the invention is applied to the NOR flash memory FM. However, the invention may be applied to other nonvolatile semiconductor memories such as a NAND flash memory and an EEPROM. The invention may also be applied to a system LSI incorporating a flash memory.

The second embodiment is such that the timing of generation of a column timing signal CLT, a sense amplifier timing signal SAT, and a data output timing signal DOT is changed in accordance with a high-level voltage of the evaluation word line EWL. However, only the timing of generation of a word timing signal WLT to be used for setting output timing of a word line signal WL (i.e., activation timing and deactivation timing of a word line WL) may be changed in accordance with the high-level signal of the evaluation word line EWL without changing the timing of generation of a column timing signal CLT, a sense amplifier timing signal SAT, and a data output timing signal DOT.

More specifically, if a high-level voltage of the evaluation word line EWL is low, the timing of generation of a word timing signal WLT is advanced. If a high-level voltage of the evaluation word line EWL is high, the timing of generation of a word timing signal WLT is delayed. This makes it possible to make the output timing of data read from the memory cell MC almost constant irrespective of the high-level voltage of the evaluation word line EWL. Therefore, the read margin can be increased and the yield of the flash memory FM can be increased accordingly.

The invention is not limited to the above embodiments and various modifications may be made without departing from the spirit and scope of the invention. Any improvement may be made in part or all of the components.

What is claimed is:

1. A nonvolatile semiconductor memory comprising:
nonvolatile normal memory cells;
a normal word line connected to said normal memory cells;
nonvolatile evaluation memory cells programmed in advance to be set to a plurality of different values, respectively;
an internal voltage generating circuit which generates, for use in an internal circuit, an internal voltage which is changeable by an adjusting signal; and
a voltage adjusting circuit which outputs said adjusting signal in accordance with cell currents in a read operation on said evaluation memory cells, to make a value of the internal voltage close to an expected value, the cell currents flowing through the respective evaluation memory cells, wherein;
said internal voltage generating circuit generates, as said internal voltage, a control voltage to be supplied to said normal word line.

2. The nonvolatile semiconductor memory according to claim 1, further comprising:
an evaluation word line connected to said evaluation memory cells, wherein:
said internal voltage generating circuit generates said control voltage to be supplied to said evaluation word line; and
said voltage adjusting circuit outputs said adjusting signal in accordance with said cell currents so as to make said control voltage close to the expected value.

3. The nonvolatile semiconductor memory according to claim 2, further comprising
a cell array in which said normal memory cells are formed, wherein
said evaluation memory cells are formed in said cell array together with said normal memory cells.

4. The nonvolatile semiconductor memory according to claim 2, further comprising
a test circuit which activates said evaluation word line during a test mode and prohibits activation of said evaluation word line during a normal operation mode.

5. The nonvolatile semiconductor memory according to claim 1, further comprising
a nonvolatile reference memory cell programmed in advance to be set to a predetermined threshold voltage and receiving a constant voltage at a control gate thereof, wherein:
said voltage adjusting circuit comprises differential sense amplifiers formed in correspondence with said respective evaluation memory cells and each having a pair of differential inputs; and each of said differential sense amplifiers is connected to a data output node of a corresponding evaluation memory cell at one of said differential inputs, and connected to a data output node of said reference memory cell at the other of said differential inputs, to output bit values of said adjusting signal from the output nodes.

6. The nonvolatile semiconductor memory according to claim 5, further comprising
a nonvolatile memory circuit which stores the bit values of said adjusting signal output from said differential amplifiers.

* * * * *